(12) United States Patent
Kreupl (10) Patent No.: US 8,097,872 B2
(45) Date of Patent: Jan. 17, 2012

(54) MODIFIABLE GATE STACK MEMORY ELEMENT

(75) Inventor: Franz Kreupl, Munich (DE)

(73) Assignee: Rising Silicon, Inc., Austin, TX (US)

( * ) Notice: Subject to any disclaimer, the term of this patent is extended or adjusted under 35 U.S.C. 154(b) by 403 days.

(21) Appl. No.: 11/708,664

(22) Filed: Feb. 20, 2007

(65) Prior Publication Data

US 2008/0101121 A1    May 1, 2008

Related U.S. Application Data

(63) Continuation-in-part of application No. 11/588,865, filed on Oct. 27, 2006, now Pat. No. 7,915,603.

(51) Int. Cl.
*H01L 29/04* (2006.01)

(52) U.S. Cl. ......... 257/3; 257/1; 257/2; 257/4; 257/324; 257/E45.002; 257/E27.004; 257/E31.029; 365/185.01; 365/185.05

(58) Field of Classification Search ............ 365/148, 365/151, 163, 185.01, 185.05, 182, 184; 257/1, 2, 3, 4, 529, E31.029, 324, 325, 326, 257/E45.002, E45.004, E27.004
See application file for complete search history.

(56) References Cited

U.S. PATENT DOCUMENTS

| | | |
|---|---|---|
| 4,077,044 A | 2/1978 | Hayashi |
| 4,599,705 A | 7/1986 | Holmberg et al. |
| 5,294,518 A | 3/1994 | Brady et al. |
| 5,330,630 A | 7/1994 | Klersy et al. |
| 5,341,328 A | 8/1994 | Ovshinsky et al. |
| 5,440,507 A | 8/1995 | Brady et al. |
| 6,903,361 B2 | 6/2005 | Gilton |
| 7,186,380 B2 * | 3/2007 | Chen et al. ............. 422/82.01 |
| 7,220,982 B2 * | 5/2007 | Campbell .................. 257/3 |
| 7,339,811 B2 * | 3/2008 | Nejad et al. ............. 365/63 |
| 7,453,716 B2 * | 11/2008 | Kim et al. ............... 365/148 |
| 2005/0127524 A1 | 6/2005 | Sakamoto et al. |
| 2005/0201143 A1 * | 9/2005 | Pinnow et al. ............. 365/149 |
| 2005/0274942 A1 | 12/2005 | Kozicki |
| 2006/0038212 A1 | 2/2006 | Moore et al. |
| 2006/0152961 A1 | 7/2006 | Kim et al. |
| 2006/0256608 A1 * | 11/2006 | Chen et al. ............. 365/148 |
| 2007/0045615 A1 | 3/2007 | Cho et al. |

FOREIGN PATENT DOCUMENTS

DE    692 14 846 T2    2/1997

(Continued)

OTHER PUBLICATIONS

Kazuyuki Takai, Structure and electronic properties of a non-graphitic disordered carbon system and its heat treatment effects, Physical Review, 2003, abstract.*

(Continued)

*Primary Examiner* — Tom Thomas
*Assistant Examiner* — Eduardo A Rodela
(74) *Attorney, Agent, or Firm* — Marger Johnson & McCollom, P.C.

(57) ABSTRACT

An apparatus and method for storing information are provided, including using an integrated circuit including a transistor having a channel, a gate oxide layer, a gate electrode, and a modifiable gate stack layer. To store information, the on-resistance of the transistor is changed by causing a non-charge-storage based physical change in the modifiable gate stack layer.

20 Claims, 6 Drawing Sheets

FOREIGN PATENT DOCUMENTS

| | | |
|---|---|---|
| DE | 103 06 076 A1 | 8/2004 |
| DE | 10 2004 011 363 A1 | 9/2005 |
| EP | 0 269 225 A2 | 6/1988 |
| EP | 1 892 722 A1 | 2/1997 |
| KR | 10-2004-0111563 | 12/2004 |
| KR | 10-0630437 | 9/2006 |
| WO | WO 98/45847 | 10/1998 |
| WO | WO 2004/070735 A1 | 8/2004 |

OTHER PUBLICATIONS

Gerstner, E.G., "Bistability in a-C for Memory and Antifuse Applications," XP-002402610, Section 10.3, Jun. 2001, pp. 318-323.

Mckenzie, D.R., et al., "Applications of Tetrahedral Amorphous Carbon in Limited Volatility Memory and in Field Progammable Gate Arrays," Diamond and Related Materials, vol. 10, 2001, pp. 230-233.

Liu, L., et al., "Controllable Reversibility of an $sp^2$ to $sp^3$ Transition of a Single Wall Nanotube Under the Manipulation of an AFM Tip: A Nanoscale Electromechanical Switch?," Physical Review Letters, vol. 84, No. 21, May 22, 2000, pp. 4950-4953.

Abelé, N., et al., "Suspended-Gate MOSFET: bringing new MEMS functionality into solid-state MOS transistor," 2005, 3 pages, IEEE.

Argall, F., "Switching Phenomena in Titanium Oxide Thin Films," Solid-State Electronics, 1968, pp. 535-541, vol. 11, Pergamon Press, Great Britain.

Baek, I.G., et al., "Highly Scalable Non-volatile Resistive Memory using Simple Binary Oxide Driven by Asymmetric Uni-polar Voltage Pulses," 2004, IEDM.

Bhattacharyya, S., et al., "Resonant tunnelling and fast switching in amorphous-carbon quantum-well structures," Jan. 2006, vol. 5, pp. 19-22, Nature Publishing Group, published online on Dec. 25, 2005 www.nature.com/naturematerials.

Gerstner, E.G., et al., "Nonvolatile memory effects in nitrogen doped tetrahedral amorphous carbon thin films," Journal of Applied Physics, Nov. 15, 1998, pp. 5647-5651, vol. 84, No. 10, American Institute of Physics.

Gibbons, J.F., et al., "Switching Properties of Thin NiO Films," Solid-State Electronics, 1964, pp. 785-797, vol. 7, Pergamon Press, Great Britain.

Hiatt, W.R., et al., "Bistable Switching in Niobium Oxide Diodes," Mar. 15, 1965, pp. 106-108, vol. 6, No. 6, Applied Physics Letters.

Kam, H., et al., "A New Nano-Electro-Mechanical Field Effect Transistor (NEMFET) Design for Low-Power Electronics," 2005, 4 pages, IEEE.

Savvides, N., "Four-fold to three-fold transistion in diamond-like amorphous carbon films: A study of optical and electrical properties," Journal of Applied Physics, Jul. 1, 1985, vol. 58, No. 1, pp. 518-521.

Seo, S., et al., "Conductivity switching characteristics and reset currents in NiO films," Applied Physics Letters, 2005, pp. 093509-1-093509-3, vol. 86, American Institute of Physics.

Seo, S., et al., "Reproducible resistance switching in polycrystalline NiO films," Applied Physics Letters, Dec. 6, 2004, pp. 5655-5657, vol. 85, No. 23, American Institute of Physics.

Takai, K., et al., "Structure and electronic properties of a nongraphitic disordered carbon system and its heat-treatment effects," Physical Review B, 2003, pp. 214202-1-214202-11, vol. 67, The American Physical Society.

\* cited by examiner

MODIFIABLE GATE STACK MEMORY ELEMENT

CROSS-REFERENCES TO RELATED APPLICATIONS

This application is a continuation-in-part of U.S. patent application Ser. No. 11/588,865, entitled "Modifiable Gate Stack Memory Element," filed Oct. 27, 2006 now U.S. Pat. No. 7,915,603.

TECHNICAL FIELD

The present invention relates generally to a memory and in one embodiment to a modifiable gate stack memory element.

BACKGROUND

Non-volatile memory, such as flash memory, retains its stored data even when power is not present. One common type of non-volatile memory is flash memory, which is used in a wide variety of electronic equipment, including digital cameras, portable audio players, wireless communication devices, personal digital assistants, peripheral devices, and for storing firmware in computers and other devices.

A key challenge for flash memory and other non-volatile memory technologies over the next few years is achieving the densities that are increasingly required by the market. This requires that the cell size be continually reduced, which introduces a variety of challenges in design and manufacturing.

For these and other reasons, there is a need for the present invention as set forth in the following embodiments.

SUMMARY OF THE INVENTION

An embodiment of the invention provides a memory cell design and method for storing information, including using an integrated circuit including a transistor having a source, a drain, a channel, a gate oxide layer, a gate electrode, and a modifiable gate stack layer. To store information, an on-resistance of the transistor is changed by causing a non-charge-storage based physical change in the modifiable gate stack layer.

These and other features of the invention will be better understood when taken in view of the following drawings and a detailed description.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION OF ILLUSTRATIVE EMBODIMENTS

Mass production of memory products, such as DRAM and NAND flash memory, with 50 nm node technology will soon be the industry norm. As memory technologies are scaled down to a 50 nm or smaller node size, it is expected that they will encounter a variety of technical issues that cannot be addressed by simply scaling existing technologies. Instead, new approaches will be needed, including new device structures, new process technologies, and new materials.

For DRAM, key design features include a storage capacitor and low leakage current at the storage node connected to the capacitor. The refresh interval, which is a key parameter describing DRAM performance, is governed by the stored charge loss at the capacitor. The leakage current at the storage node includes leakage through the capacitor itself, junction leakage current at the storage node, and sub-threshold conduction from a cell transistor. As the design rule shrinks down, the capacitance of the storage capacitor decreases due to the reduced effective capacitor surface area, and the junction leakage current at the storage node increases due to increased channel doping concentration. Below 100 nm, TIT (Ti/Insulator/Ti) capacitors have been used, and atomic layer deposition (ALD) has been used for capacitor dielectric formation. Other kinds of high-k dielectric materials have also been developed for such uses, including $HfO_2$ and $HfO_2/Al_2O_3$ (for an approximately 80 nm node), and $ZrO_2$ (approximately 60 nm node). Below a 50 nm node, RIR (Ru/Insulator/Ru) may be a promising candidate for the production of capacitors for use in DRAM. However, in practice, the integration complexity of Ru may limit its use in mass production.

In addition to the development of new materials, new structures have also been developed to assist in the scaling of DRAM. For example, a new structure called MESH-CAP is expected to extend the use of TIT capacitors to a 50 nm node size.

Difficulties with leakage in DRAM should also be addressed. For example, the doping profile at the storage node is the main cause of leakage, and is determined by the channel doping concentration of a cell transistor and the out diffusion from the poly-Si plug contact. Planar transistor designs have difficulty satisfying leakage current requirements at node sizes below 100 nm. New, 3-D cell structures, called RCAT (Recess Channel Array Transistor) and S-RCAT (Sphere-shaped Recess Channel Array Transistor) have been introduced to address these difficulties. The RCAT design, for example, lengthens the effective gate length of the cell transistor, alleviating problems due to the short channel effect without increasing the area of the cell. Below a 50 nm node size, it is expected that other new designs, such as FinFETs, and double gate ultra thin body (UTB) transistors will be used. FinFETs, for example, generally have a superior current driving capability, and short channel immunity as compared to RCATs.

With respect to leakage due to out diffusion from the poly-Si plug, this may be addressed using an elevated source/drain structure using selective epitaxial growth. Using this structure, the short channel effect can be effectively suppressed by forming a shallow junction, and room may be provided for transistor engineering, for example for a FinFET having an extremely low-doped channel. Use of such a structure may also provide a wider process window for memory cell contact stability.

Figure 1:
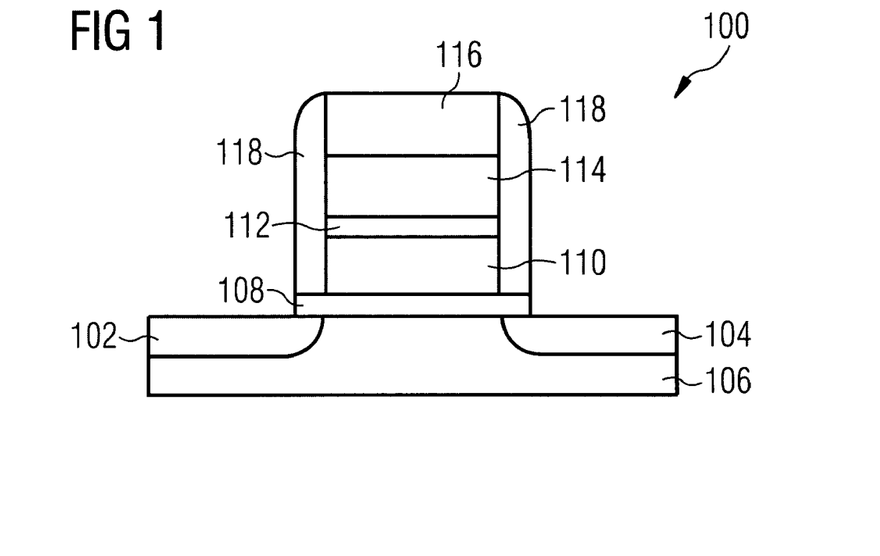
FIG. 1 shows a conventional flash memory cell.

NAND flash memory also faces challenges related to scaling. FIG. 1 shows a conventional flash memory cell 100 for use in a NAND flash memory array. The memory cell 100 includes a source region 102 and a drain region 104, formed in a substrate 106. Formed above the substrate 106 are a tunnel oxide layer 108, a floating gate 110, an insulating layer 112 (also known as an inter-poly dielectric, or IPD), and a control gate 114. A word line 116 connects to the control gate 114. This stack of layers that makes up the cell is bounded by sidewalls 118. In operation, data is written to a conventional NAND flash memory cell, such as flash memory cell 100, by applying a high bias voltage, such as 18V, between the control gate 114 and the source region 102 and drain region 104. Under these conditions, electrons may tunnel across the tunnel oxide layer 108 into the floating gate 110. To erase the flash memory cell 100, the voltage at the substrate 106, the source region 102, and/or the drain region 104 is increased, causing electrons stored on the floating gate 110 to tunnel across the tunnel oxide layer 108, to the substrate 106, the source region 102, and/or the drain region 104. Alternatively, the electrons can be caused to tunnel across the insulating layer 112 to the control gate 114 to effectively erase the flash memory cell 100.

The charge stored on the floating gate 110 modifies the threshold voltage of the flash memory cell 100, which is the voltage that is applied to the control gate 114 to permit a current to flow between the source region 102 and the drain region 104. Thus, the flash memory cell 100 can be read by applying a selected voltage to the control gate 114, and measuring the current flow between the source region 102 and the drain region 104. Depending on the charge stored on the floating gate 110, the selected voltage that is applied for reading will either be above or below the threshold voltage, representing a "1" or a "0". Additionally, multiple bits may be stored in the flash memory cell 100, for example, by varying the charge stored on the floating gate 110 to provide several possible levels for the threshold voltage.

Because the memory effect of the flash memory cell 100 depends on storing a charge on the floating gate 110, the tunnel oxide layer 108 should be thick enough to prevent substantial loss of the charge on the floating gate 110. For example, due to direct tunnelling, 20% of the charge on the floating gate 110 may be lost in less than five minutes if the tunnel oxide layer 108 has a height (thickness) of 4 nm. With a tunnel oxide layer 108 that is approximately 5 nm in height, it takes approximately one day for the floating gate 110 to lose approximately 20% of its charge due to direct tunnelling. To prevent this loss due to direct tunnelling (within a commercially acceptable time period), conventional flash memories typically have a tunnel oxide layer that is between 8 nm and 12 nm in height. Even on newer types of flash memory, such as SONOS flash, which uses silicon nitride (SiN) to more effectively trap the charge, the tunnel oxide layer typically has a height of at least 4 nm.

Scaling problems that may be encountered when reducing the size of a flash memory cell include physical scaling challenges, electrical scaling challenges, and reliability challenges. One physical scaling challenge is that as word line space in an array is scaled down, there may be increased capacitance coupling among unrelated floating gates, causing a shift in the threshold voltage. This coupling may be reduced by reducing the height of the floating gates and/or using low-k dielectric materials. Additionally a SONOS-type cell structure can be used to reduce or effectively eliminate such floating gate interference.

Another physical challenge is that the sidewalls of the floating gate in the word line direction may not be correctly fabricated because the physical thickness of the inter-poly dielectrics may be larger than the space between floating gates as the flash memory device is scaled down. Since the contribution of the sidewalls to the coupling ratio from the control gate to the floating gate is reduced by lowering the floating gate height, the coupling ratio may drop to below 0.3 at a 30 nm node. To enhance the coupling ratio, inter-poly ONO dielectrics may be scaled down to 15 nm. As another approach, high-k dielectric materials, such as $Al_2O_3$ and $HfO_2$ can be used. Additionally, a new cell structure, called a U-shaped NAND flash may have an increased coupling ratio through inter-poly dielectric area enhancement.

Electrical scaling issues, such as the short channel effect due to short gate length and driving current reduction due to narrow active width may become serious as the scale of flash memory is reduced. Below a 30 nm node size, these challenges may degrade the sensing margin and the device operation speed, particularly for multi-level cell operation. To attempt to overcome these difficulties, structures such as FinFETs and booster plate structures may be used. Because FinFETs use the sidewall channel as well as the top planar surface, the driving current can be increased. Additionally FinFETs have reasonably strong immunity to the short channel effect. In a booster plate structure, the short channel effect is reduced due to suppressed programming interference in unselected cells.

Reliability issues when scaling a flash memory device result from the significant decrease in the number of electrons on the floating gate due to the decrease in the capacitance of the inter-poly dielectric as the cell size decreases. For example, with a 30 nm design rule, it is expected that less than 100 electrons stored on the floating gate will result in a threshold voltage shift of 6V. As the charge loss tolerance becomes less than 10 electrons, data retention and endurance failures become likely. As explained above, data retention concerns also limit the ability to aggressively scale the tunnel oxide layer.

In addition to scaling challenges related to the size of memory cells in flash memory, there are also scaling issues related to peripheral devices. The high electric fields required for programming and erasing conventional flash memory cause scaling in peripheral devices to lag behind, due to the need to support high voltage requirements. Use of new cell structures, such as SONOS, as well as the development of high-k dielectric materials may provide room for scaling such high voltage peripheral devices.

For NAND flash devices, it is expected that conventional floating gate designs will be continuously scaled down to a 50 nm node size. Below that size, it is expected that SONOS-like NAND flash, and combinations of FinFET and SONOS-like cell structures may be used. Additionally a TANOS cell, which uses a dielectric composite of $SiO_2/SiN/Al_2O_3$ and TaN may be used. The high-k dielectrics with good band gap matching between the blocking oxide and the charge trapping layer in this type of cell improves the coupling ratio onto the tunnel oxide. This results in the possibility of thicker dielectrics, with improved charge loss characteristics and faster erase.

In addition to DRAM and flash memory, which are charge-based, other types of non-charge based memories, including phase change random access memory (PCRAM) and conductive bridging random access memory (CBRAM) provide promising memory technologies. Both PCRAM and CBRAM are nonvolatile memories, and, because they are not charge based, may be immune to some of the data retention issues associated with scaling flash memories. CBRAM, or programmable metallization cell (PMC) memory is of particular interest in this respect.

PMC memory, or CBRAM uses electrochemical control of nanoscale quantities of metal in thin films of a solid electrolyte to store information. Key attributes of CBRAM include low voltage and current operation, a high degree of scalability, and relatively simple fabrication. Device formation involves the dissolution of silver or copper in a chalcogenide (e.g., germanium selenide, germanium sulphide) or oxide (e.g., tungsten oxide) base glass to create a solid electrolyte. A silver or copper-containing layer and inert electrode formed in contact with the electrolyte film creates a device in which information is stored via electrical changes caused by the oxidation of the silver or copper metal and reduction of silver or copper ions in the electrolyte. This occurs at an applied bias as low as a few hundred mV, and can result in a resistance change of many orders of magnitude within tens of nanoseconds, even for currents in the μA range. A reverse bias of the same magnitude will reverse the process until the electrodeposited metal has been removed, thereby erasing the device. Since information is retained by metal atom electrodeposition rather than charge-based storage, CBRAM has excellent retention characteristics.

Figure 2A:
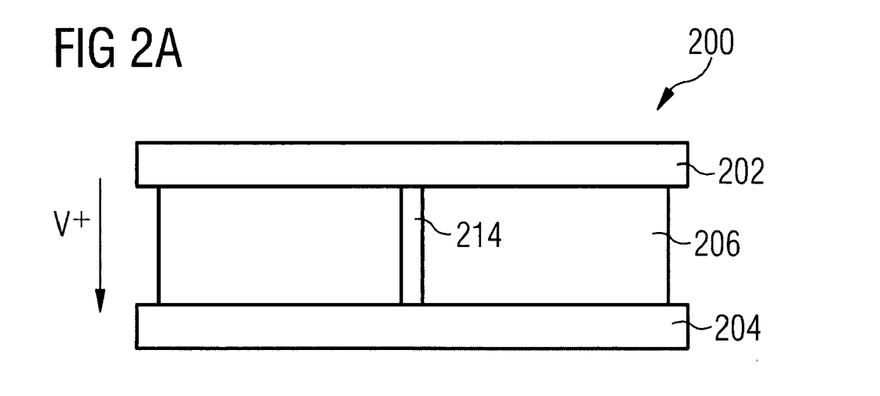
FIGS. 2A and 2B show a conventional CBRAM cell.

FIG. 2A shows a conventional conductive bridging junction (CBJ) for use in a conductive bridging random access memory (CBRAM) cell. A CBJ 200 includes a first electrode 202, a second electrode 204, and a solid electrolyte block 206 sandwiched between the first electrode 202 and the second electrode 204. One of the first electrode 202 and the second electrode 204 is a reactive electrode, the other is an inert electrode. In this example the first electrode 202 is the reactive electrode, and the second electrode 204 is the inert electrode. The first electrode 202 includes silver (Ag) in this example, and the solid electrolyte block 206 includes a silver-doped chalcogenide material.

When a voltage is applied across the solid electrolyte block 206, a redox reaction is initiated that drives Ag+ ions out of the first electrode 202 into the solid electrolyte block 206 where they are reduced to Ag, thereby forming Ag rich clusters within the solid electrolyte block 206. The size and the number of Ag rich clusters within the solid electrolyte block 206 may be increased to such an extent that a conductive bridge 214 between the first electrode 202 and the second electrode 204 is formed.

Figure 2B:
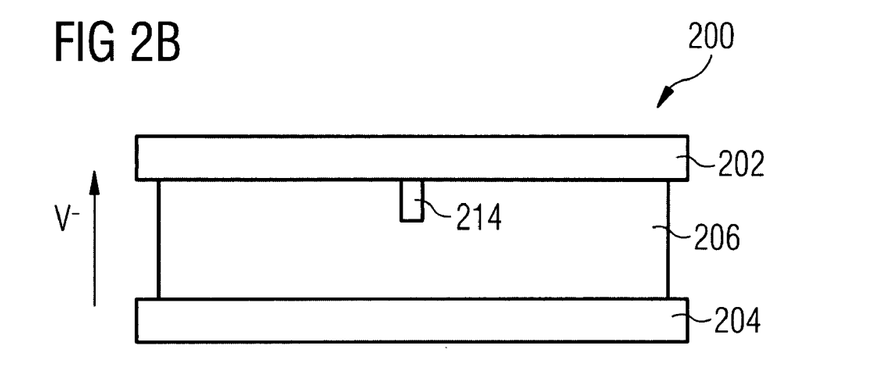

As shown in FIG. 2B, when an inverse voltage to that applied in FIG. 2A is applied across the solid electrolyte 206, a redox reaction is initiated that drives Ag+ ions out of the solid electrolyte block 206 into the first electrode 202 where they are reduced to Ag. As a consequence, the size and the number of Ag rich clusters within the solid electrolyte block 206 is reduced, thereby reducing, and eventually removing the conductive bridge 214.

To determine the current memory state of the CBJ 200, a sensing current is routed through the CBJ 200. The sensing current encounters a high resistance if no conductive bridge 214 exists within the CBJ 100, and a low resistance when a conductive bridge 214 is present. A high resistance may, for example, represent "0", while a low resistance represents "1", or vice versa.

The solid electrolyte block 206 can include many materials, but the materials of greatest interest for use in CBRAM are the chalcogens, including oxygen (O), sulphur (S), and selenium (Se). Combining these with copper (Cu) or silver (Ag) yields binary electrolytes, such as $Ag_2Se$ or $Cu_2S$. Alternatively, a transition metal, such as tungsten (W) can be reacted with oxygen to form a suitable base glass for an electrolyte. If, for example, the resulting tungsten oxide is sufficiently porous and in its trioxide form ($WO_3$), silver or copper ions will be mobile within the material, and can form electrodeposits. Another approach is to combine chalcogens with other elements, such as germanium, to create a base glass into which Cu or Ag may be dissolved. An example of such an electrolyte is Ag dissolved in $Ge_{30}Se_{70}$ (e.g., $Ag_{33}Ge_{20}Se_{47}$). This takes the form of a continuous glassy $Ge_2Se_3$ backbone and a dispersed $Ag_2Se$ phase which is superionic and allows the electrolyte to exhibit superionic qualities. The nanostructure of this material, and of its sulphide counterpart, provide good characteristics for use in switching devices, such as CBRAM. The metal-rich phase is both an ion and an electron conductor, but the backbone material that separates each of these conducting regions is a good dielectric, so the overall resistance of the material prior to electrodeposition is high.

A solid electrolyte, such as those used in CBRAM, can be made to contain ions throughout its thickness. The ions nearest the electron-supplying cathode will move to its surface and be reduced first. Non-uniformities in the ion distribution and in the nano-topography of the electrode will promote localized deposition or nucleation. Even if multiple nuclei are formed, the one with the highest field and best ion supply will be favored for subsequent growth, extending out from the cathode as a single metallic nanowire. The electrodeposition of metal on the cathode physically extends the electrode into the electrolyte, which is possible in solid electrolytes, particularly if they are glassy in nature, and are able to accommodate the growing electrodeposit in a void-rich, semi-flexible structure.

Because the electrodeposit is connected to the cathode, it can supply electrons for subsequent ion reduction. This permits the advancing electrodeposit to harvest ions from the electrolyte, plating them onto its surface to extend itself forward. Thus, in an electrolyte containing a sufficient percentage of metal ions, the growing electrodeposit is always adjacent to a significant source of ions, so the average distance each ion travels in order to be reduced is, at most, a few nm.

The resistivity of the electrodeposit is orders of magnitude lower than that of the surrounding electrolyte, so once the electrodeposit has grown from the cathode to the anode, forming a complete conductive bridge, the resistance of the structure drops considerably. The decreasing resistance of the structure due to the electrodeposition effect increases the current flowing through the device until the current limit of the source is reached. At this point, the voltage drop falls to the threshold for electrodeposition, and the process stops, yielding the final "on" resistance of the structure.

As noted above, the electrodeposition process is reversible by changing the polarity of the applied bias. If the electrodeposit is made positive with respect to the original oxidizable electrode, it becomes the new anode, and will dissolve via oxidation. During the dissolution of the conductive bridge, balance is maintained by electrodeposition of metal back into the place where the excess metal for the electrodeposition originated. The original growth process of the conductive bridge will have left a low ion density region in the electrolyte surrounding the electrode, and this "free volume" will favor redeposition without extended growth back into the electrolyte. Once the electrodeposit has been completely dissolved, the process will self-terminate, yielding the final "off" resistance of the structure. The asymmetry of the structure facilitates the cycling of the device between a high-resistance "off" state, and a low-resistance "on" state, permitting the device to operate as a switch or memory element.

It should be noted that a similar principle will also work in a vacuum, where the tunnelling current through the vacuum drives the ions. For example, a nanoscale silver bridge may be formed in a vacuum in a small gap between a platinum lead and layer of $Ag_2S$. The process of forming this bridge may be reversed and repeatedly rapidly, as only a few atoms are involved. Similar metal-vacuum systems that use gold or copper conductive bridges may also be constructed.

Unlike flash memory, in conventional CBRAM cells, as well as in memory cells for other resistive memory technologies, such as PCRAM or binary transition metal oxide resistive random access memories (OxRRAM), the non-volatile memory cell is separated from the transistor. This can lead to larger and less scalable memory cells. Other new proposed technologies, such as nano-electromechanical FETs and suspended gate techniques also may have difficulties with scalability.

In accordance with an embodiment of the invention, a memory cell can be constructed using a flash-like structure, that combines the memory element with a transistor, but that uses a non-charge-storage based element at the gate. For example, a solid electrolyte, such as is used in CBRAM may be incorporated in the gate stack. By growing field induced filaments in the gate stack at high gate voltages, the threshold voltage or on-resistance of the transistor at lower gate voltages may be modified. A sharp filament develops a very high field in its vicinity and leads to a very strong modulation of the conductivity of the device channel according to the length of the filament and the proximity of the filament to the transistor channel. The on-resistance of the device is the voltage difference between the source and the drain voltage, divided by the current that flows between source and drain at a given gate voltage. Depending on the geometry of the filament, such as its length and proximity to the channel, the on-resistance of the transistor varies considerably at a given gate voltage. Thus, use of the modifiable gate stack provides a new memory device that is not based on stored charges near the channel, but on a reconfigurable geometry of the gate electrode, which modulates the channel depending on the configuration. Such a memory cell can be scaled down to very small feature sizes, and can be arranged in structures similar to those used with NAND or NOR flash memory to achieve a similar storage density. Additionally, other non-charge-storage based resistive switching elements, such as a phase change material similar to those used in PCRAM, or binary transition metal oxide resistive memories, or a carbon-based switching element in which conductive filaments of $sp^2$-rich carbon are formed in an insulating layer of $sp^3$-rich amorphous carbon, may be used instead of a solid electrolyte to modify the threshold voltage or on-resistance of the transistor at a given gate voltage.

Because the memory is not charge-storage based, the reliability of information storage may be less problematic, even when the device is scaled down to very small feature sizes. Additionally, the tunnel oxide (or gate oxide) thickness can be scaled to 3 nm or less, since the tunnel oxide does not need to prevent loss of the charge on a floating gate, and a thin tunnel oxide layer may be advantageous during programming. Further, the programming of such non-charge-storage based devices cannot be erased by irradiation with UV light or by exposure to a $Co_{60}$ or other radiation source with a total dose of approximately 1 MRad, as in the case with many charge-storage based memories.

Figure 3:
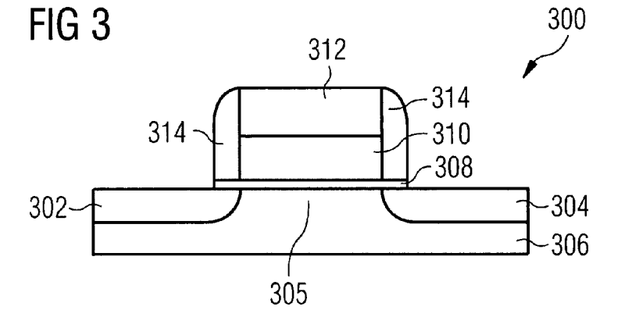
FIG. 3 shows a memory cell in accordance with an embodiment of the invention.

Referring to FIG. 3, a memory cell in accordance with one embodiment of the invention is described. The memory cell 300 is structured as a semiconductor transistor that incorporates a solid electrolyte, such as is found in CBRAM, into the gate stack of the transistor, providing a flash-like memory cell that is highly scalable. Unlike a flash memory cell, the memory cell 300 is not charge-storage based, instead using a field to induce the growth of filaments in the solid electrolyte, similar to CBRAM, to shift the threshold voltage and/or on-resistance of the cell. Advantageously, because it is not charge-storage based, the memory cell 300 is not subject to the same kinds of reliability problems that can afflict flash memory as scale is reduced.

The memory cell 300 includes a source region 302, a drain region 304, and a channel 305 formed in a substrate 306. In some embodiments, the substrate 306 may be a P-type substrate, and the source region 302 and drain region 304 may be N+ doped regions.

A gate oxide layer 308, in some embodiments having a height of 3 nm or less, and in some embodiments having a height of 1 nm, is deposited above the substrate 306. A modifiable gate stack 310 is formed above the gate oxide layer 308. A gate electrode 312 is disposed above the modifiable gate stack 310. The modifiable gate stack 310 and gate electrode 312 are bounded by sidewalls 314.

The modifiable gate stack 310 is formed of a solid electrolyte, such as a chalcogenide glass, though it will be understood that the modifiable gate stack 310 may include other suitable materials, such as copper oxide, binary transition metal oxides like nickel oxide, zirconium oxide, titanium oxide, an aluminium or aluminium rich oxide, or a $SrZrO_3$ film. Other structures, such as a metal-vacuum system, including silver, gold, or copper vacuum systems, or a carbon bi-layer system may also be used in the modifiable gate stack 310. As will be described in greater detail below, a conducting filament may be grown in the modifiable gate stack 310 at high gate voltages. This conducting filament will have an effect on the threshold voltage or on-resistance of the transistor at lower gate voltages. These changes in threshold voltage or on-resistance can be used to store information.

Figure 4A:
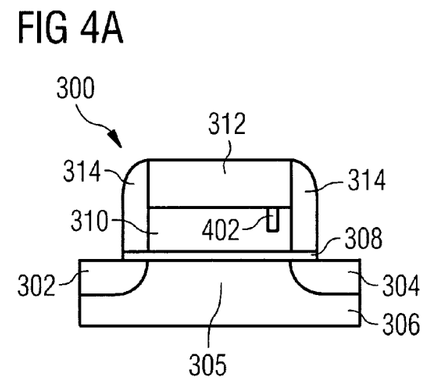
FIGS. 4A and 4B show the growth of a conductive filament in the gate stack of a memory cell in accordance with an embodiment of the invention.
Figure 4B:
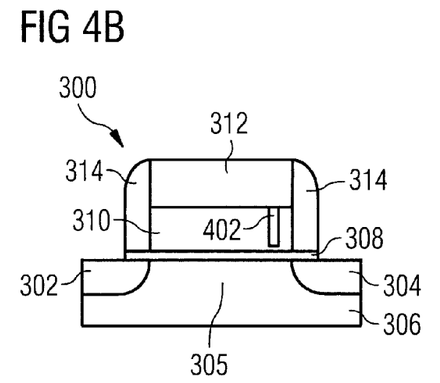

FIGS. 4A and 4B show the memory cell 300 with a filament 402 growing in the modifiable gate stack 310. The presence of the filament 402 alters the conductivity of the modifiable gate stack 310, which changes the coupling of the gate voltage on the transistor channel 305 by changing the threshold voltage or the on-resistance of the of the transistor/memory cell 300. The filament 402 grows along a field produced by applying a tunnelling current through the gate oxide layer 308 at high voltages. Generally, a voltage of less than 1V/nm of thickness of the modifiable gate stack will be sufficient for formation of the filament 402, but higher voltages may be used.

As an example, if the modifiable gate stack 310 is a silver-doped chalcogenide material, and the gate electrode 312 contains silver, then the field produced at a high voltage will cause a redox reaction that will drive Ag+ ions out of the gate electrode 312 into the modifiable gate stack 310. Within the modifiable gate stack 310, these ions will be reduced to Ag, forming Ag-rich clusters within the modifiable gate stack 310. Similar to the formation of a conductive bridge in CBRAM devices, these Ag-rich clusters form the filament 402. The filament 402 may be reduced or removed by reversing the current flow at high voltages.

Depending on the strength of the field and the amount of time spent growing the filament 402, as seen in FIG. 4B, the filament 402 may be grown to varying lengths. Different filament lengths lead to differences in the conductivity of the modifiable gate stack 310, and differences in the threshold voltage or on-resistance at a given gate voltage of the memory cell 300. This ability to control the threshold voltage or conductivity of the transistor channel may be used to store multiple bits of information in the memory cell 300. For example, by distinguishing between four different threshold voltages or conductivity states of the transistor, two bits of information may be stored in the memory cell 300.

Figure 5A:
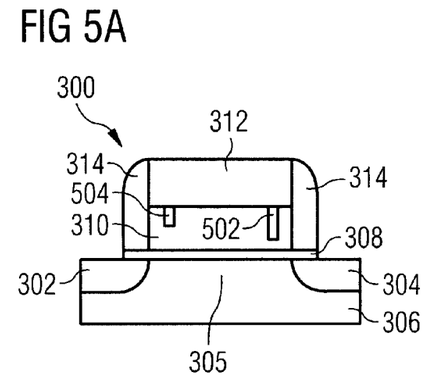
FIGS. 5A and 5B show the growth of two filaments in the gate stack of a memory cell in accordance with an embodiment of the invention.
Figure 5B:
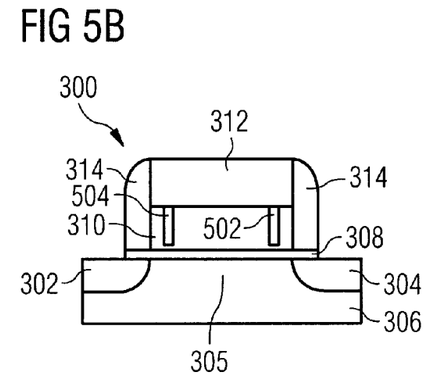

As shown in FIGS. 4A and 4B, the filament 402 is growing on the drain side of the memory cell 300. This can be accomplished by applying a bias between the gate electrode 312 and the drain region 304, to apply a current through the modifiable gate stack 310. This current will typically be in the range of approximately 100 nA to 100 μA, which is much higher than the femtoamps of current that are usually applied when writing a conventional flash memory. The field that is used to grow such a filament may be produced on either the source or the drain side of the memory cell 300, depending on biasing. Thus, as shown in FIGS. 5A and 5B, two filaments 502 and 504, respectively, may be produced in the modifiable gate stack 310, and may be grown to varying lengths, by applying an appropriate bias between the gate electrode 312 and the source region 302 (for the filament 502) and between the gate electrode 312 and the drain region 304 (for the filament 504).

Figure 6:
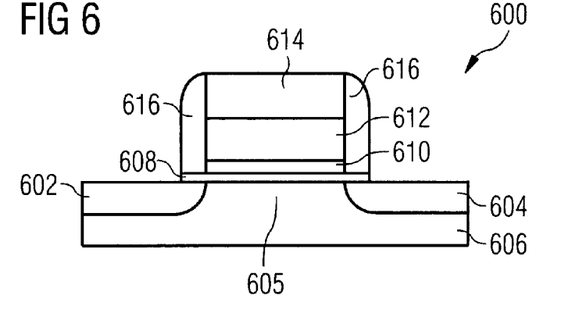
FIG. 6 shows an alternative embodiment of a memory cell in accordance with the invention.

FIG. 6 shows an alternative embodiment of a memory cell in accordance with the invention. As in other embodiments, the memory cell 600 is structured as a semiconductor transistor incorporating a solid electrolyte into the gate of the transistor. The memory cell 600 includes a source region 602, a drain region 604, and a channel 605 formed in a substrate 606. A gate oxide layer 608 is disposed above the substrate 606, and a gate plate layer 610 is formed above the gate oxide layer 608. The gate plate layer 610 may include a poly-Si material, a metal, such as Mo, W, or Cr, a conductive carbon material, or other suitable conductive material. A modifiable gate stack 612, formed of a solid electrolyte, is disposed above the gate plate layer 610, and a gate electrode 614 is disposed above the modifiable gate stack 612. Sidewalls 616 are located at edges of the memory cell 600.

Figure 7A:
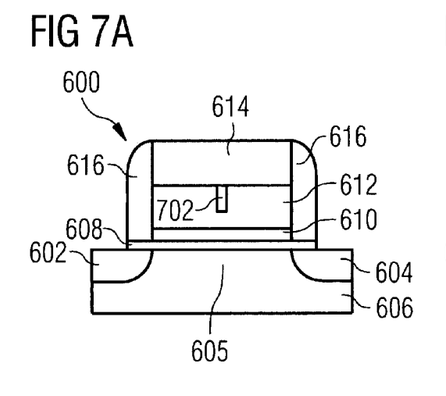
FIGS. 7A and 7B show the growth of a conductive filament in the gate stack of an alternative embodiment of a memory cell in accordance with the invention.
Figure 7B:
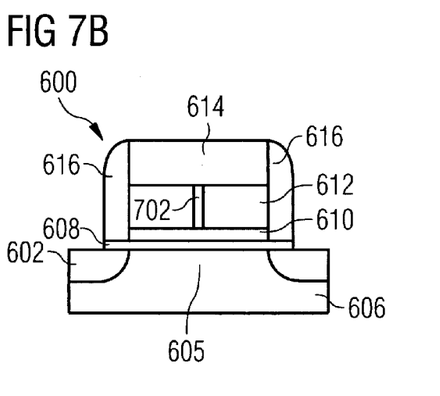

The presence of the gate plate layer 610 will have effects on the current flowing through the modifiable gate stack 612. As shown in FIGS. 7A and 7B, in the presence of the gate plate layer 610, a filament 702 may be grown through a central portion of the modifiable gate stack 612.

Figure 8:
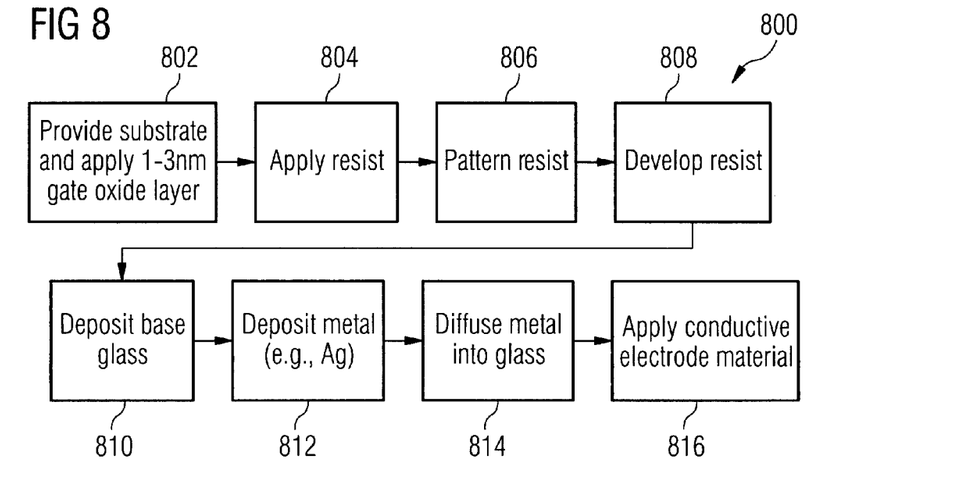
FIG. 8 is a block diagram of a method of fabricating a memory cell in accordance with an embodiment of the invention.

FIG. 8 shows an example of a method 800 of manufacturing an integrated circuit including a memory cell similar to the memory cell 300 shown in FIG. 3, using a chalcogenide glass as a solid electrolyte material. In step 802, conventional processing is used to provide a substrate, over which a 1-3 nm thick gate oxide layer is applied. In step 804, a first photo-resist material, such as a polymethyl methacrylate (PMMA) photo-resist material, is deposited on the gate oxide layer. The photo-resist material may be applied, for example, by spin casting, after which the resist may be baked at approximately 170° C. for about 18 hours, to ensure complete solvent removal.

In step 806, the resist is patterned by exposing the resist using known lithography techniques to define nanoscale openings aligned to the substrate. For example, the resist may be exposed using an electron beam lithography system, such as a JEOL 600 e-beam lithography system, with an area dose of approximately 1200 μC/cm$^2$. In step 808, the resist is developed, to produce high-resolution patterns in the resist, with steep sidewalls. This can be achieved, for example, by exposing the patterned resist for approximately 20 seconds in a developer including 11:10:1 MIBK:CS:MEK, where MIBK is 1:3 methyl isobutyl ketone:isopropanol, CS is 3:7 2-ethoxyethanol:methanol, and MEK is 2.65:7.35 methyl ethyl ketone:ethanol, followed by an approximately 30 second isopropyl alcohol (IPA) rinse. This will lead to high-resolution patterns in the PMMA, with steep sidewalls.

In step 810, approximately 20 nm of base glass is deposited. This can be achieved by evaporation from a $Ge_{30}Se_{70}$ source under high vacuum conditions (approximately $10^{-6}$ Torr), using, for example, a resistively heated Knudsen-type cell or electron beam evaporation, to ensure that the composition of the deposited film is close to that of the source material. A low deposition rate between approximately 0.01 nm/sec and approximately 0.1 nm/sec, and preferably approximately 0.03 nm/sec may provide good step coverage and fill in narrow vias.

In step 812, approximately 30 nm of Ag is deposited. This can be accomplished through evaporation, without breaking vacuum from the depositing the glass. The thickness combination of approximately 20 nm of base glass and approximately 30 nm of Ag is intended to ensure complete saturation of the glass with Ag throughout its depth, while leaving a thin (approximately 10 nm) residual Ag surface layer when diffusion is complete.

In step 814, the Ag is diffused into the glass. This may be achieved, for example, through an approximately 70 minute exposure to a 0.35 W/cm$^2$ incandescent (tungsten) broad spectrum source to provide both heat and light for the dissolution of the Ag into the base glass. This will provide an approximate steady state substrate temperature during this step, as measured by a temperature sensor in contact with the sample back, of approximately 100° C., which is well below the glass transition temperature of any of the materials that are being used. The exposure is performed under high vacuum conditions, to avoid oxidation of the electrolyte layer.

In step 816, a second electrode material, such as 100 nm of Ag or any other gate metal, is deposited. This may be accomplished, for example, by evaporation, without breaking vacuum.

In an alternative embodiment, an integrated circuit including a memory cell such as is shown in FIG. 6 may be fabricated by depositing a conductive layer on the gate oxide, after the resist is developed (step 808), and prior to depositing the chalcogenide layer (step 810). This conductive layer may include a conductive material, such as a poly-Si gate plate, a metal gate plate (including, for example, Mo, W, or Cr), or a conductive carbon layer.

Figure 9A:
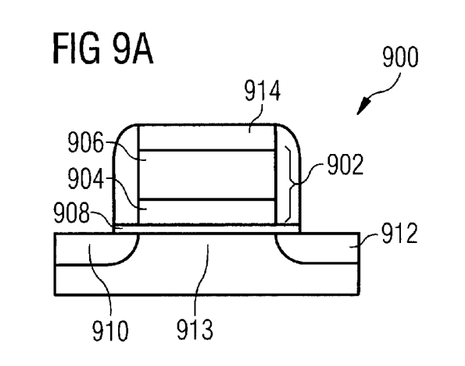
FIGS. 9A and 9B show another alternative embodiment of a memory cell in accordance with the invention.

FIG. 9A shows an alternative embodiment of a memory cell in accordance with the invention. The memory cell 900 includes a carbon bi-layer system 902, which includes two layers of amorphous carbon. The first layer 904 is an insulating layer, which includes a 2-3 nm carbon film rich in $sp^3$ hybridized carbon. The second layer 906 is a conductive layer, rich in $sp^2$ hybridized carbon. The memory cell 900 also includes a gate oxide layer 908, a source region 910, a drain region 912, a channel 913, and an optional contact layer 914, which includes a metal or other highly conductive material. The second layer 906 also serves as a gate electrode.

Figure 9B:
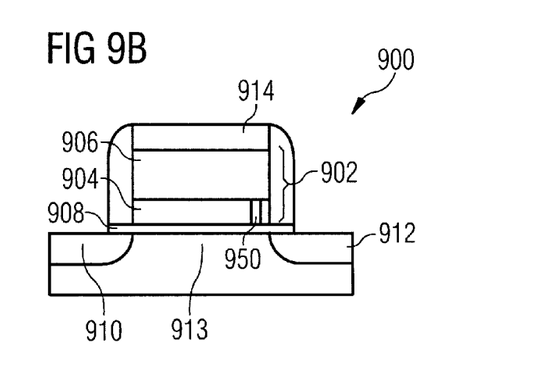

As shown in FIG. 9B, in operation, by forcing a current through the carbon bi-layer system 902, an $sp^2$ filament 950 can be formed in the $sp^3$-rich first layer 904, changing the conductivity (and resistance) of the carbon bi-layer system. Within the first layer 904, the current causes a change in the structure of the material, from atomic scale $sp^2/sp^3$ disorder to a disordered graphitic $sp^2$-domain network, through the migration of $sp^3$ defects. The current induces the migration of $sp^2$-rich clusters to form a percolation path network of graphitic $sp^2$ domains, which causes an insulator-to-metal transition. Electron transport in the $sp^2$-rich metallic state features weakly temperature-dependent conductivity with a majority of hole and a minority of electron carriers. A one-dimensional channel arises due to filamentary conduction through localized $sp^2$-rich regions within the $sp^3$ carbon barriers, and particularly within the barrier adjacent to the electron injector. This limits the electrical conduction at low bias. Additionally, this may involve the orientation of $\pi$ orbitals of $sp^2$-bonded carbon molecules when subject to a high electric field, leading to increased electron transmission.

Application of a current with reversed polarity reverses the migration of $sp^2$ domains in the $sp^3$-rich first layer 904, reducing the $sp^2$ filament 950, and the conductivity (and resistance) of the carbon bi-layer system 902. Similar to other embodiments, changes in the resistance of the carbon bi-layer system cause changes in the coupling of the gate electrode to the transistor channel and therefore the threshold voltage or on-resistance of the cell. Optionally, an additional conductive $sp^2$-rich carbon layer (not shown) may be placed above the gate oxide layer 908, to serve a function similar to the gate plate layer in other embodiments. Other materials, such as a nickel oxide/nickel stack in which conductive filaments may be formed may also be used in a similar manner to the carbon bi-layer system in a memory cell according to the invention.

Figure 10:
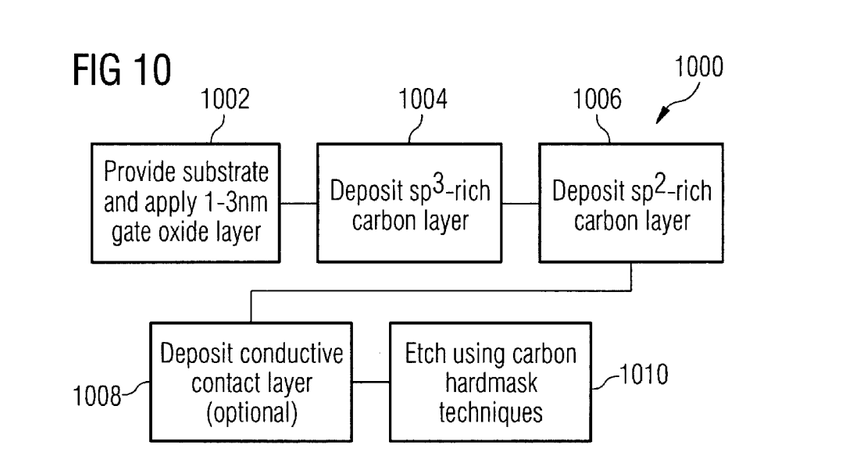
FIG. 10 is a block diagram of a method of fabricating a memory cell in accordance with an alternative embodiment of the invention.

Referring to FIG. 10, a method 1000 for fabricating an integrated circuit including a carbon bi-layer based memory cell in accordance with an embodiment of the invention, such as is shown in FIG. 9, is described. In step 1002, conventional processing is used to provide a substrate, over which a 1-3 nm thick gate oxide layer has been applied. In step 1004, a 2-3 nm layer of nonconductive $sp^3$-rich amorphous carbon is deposited. In step 1006, a layer of conductive $sp^2$-rich amorphous carbon is deposited. While this layer can have almost any suitable thickness, in an example embodiment, the layer is approximately 10-50 nm thick. In step 1008, this carbon layer may optionally be topped by a conductive layer, including a metal such as Mo, Ti, Ta, or another metal or suitable highly conductive material. In step 1010 conventional carbon hard-mask techniques are used to etch the stack. Processing of the device may then continue according to conventional fabrication techniques.

Optionally, an additional conductive carbon layer with a thickness of approximately 1 nm may be deposited between the gate oxide layer and the $sp^3$-rich amorphous carbon layer. Such a layer may be deposited prior to step 1004.

Figure 11:
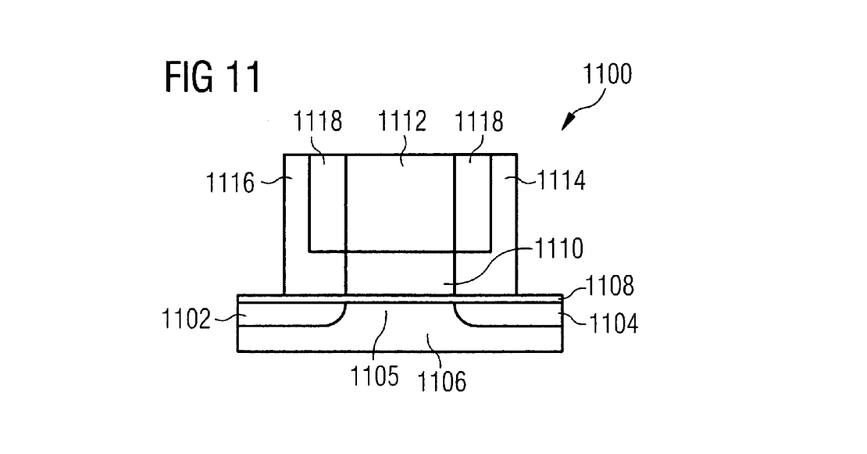
FIG. 11 shows a memory cell using a phase change material in the gate stack, in accordance with an alternative embodiment of the invention.

In addition to using a CBRAM-like non-charge based means of modifying the coupling of a gate to the channel, other forms of material having modifiable conductivity may be used in the gate stack. For example, a phase change material, such as is used in PCRAM, may be used. FIG. 11 shows an embodiment based on a temperature-dependent phase change material, such as Si, poly-Si, amorphous carbon, a chalcogenide, or other suitable phase change material. The memory cell 1100, which also forms a transistor, includes a source region 1102 and a drain region 1104 in a substrate 1106. A gate oxide layer 1108, which may include, for example, 1-3 nm of $SiO_2$, is deposited above the source region 1102, drain region 1104, and channel region 1105 in substrate 1106. A phase change material 1110, that changes its conductivity when heated, is located above the gate oxide layer 1108, and is connected to a gate contact layer 1112, which includes a highly conductive material, such as W, WSi, poly-Si, Ni, NiSi, or other suitable conductive materials. An "in" line 1114 and an "out" line 1116 are connected to the phase change material 1110 to provide a current for heating the phase change material to change its conductivity. Insulators 1118, which may include, for example, $SiO_2$, separate the "in" line 1114 and "out" line 1116 from the gate contact layer 1112.

In operation, the "in" line 1114 and "out" line 1116 are used to apply a current through the phase change material 1110 to heat the phase change material 1110. Depending on the temperature to which it is heated, the phase change material 1110 can become highly conductive (typically a conductive crystal form) or highly resistive (generally, a non-conductive amorphous form). Typically, the material switches to a conductive state at a temperature above a crystallization temperature of the material, but below a melting temperature, while a resistive state is achieved by heating the material above its melting temperature. Intermediate values of conductivity may also be achieved, depending on the temperature. As with other embodiments of the invention, changes in the conductivity of the material cause changes in the threshold voltage or on-resistance at a given gate voltage for the memory cell 1100.

Figure 12A:
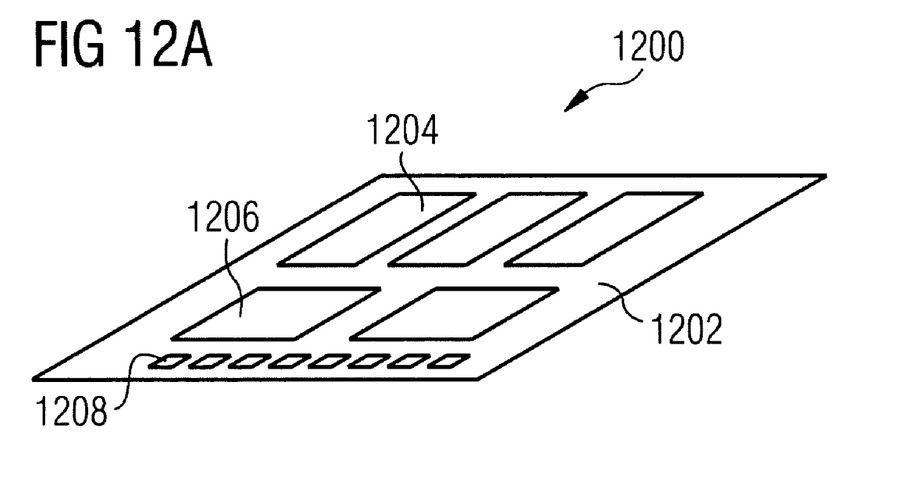
FIGS. 12A and 12B show a memory module and a stackable memory module, respectively, using memory cells in accordance with an embodiment of the invention.
Figure 12B:
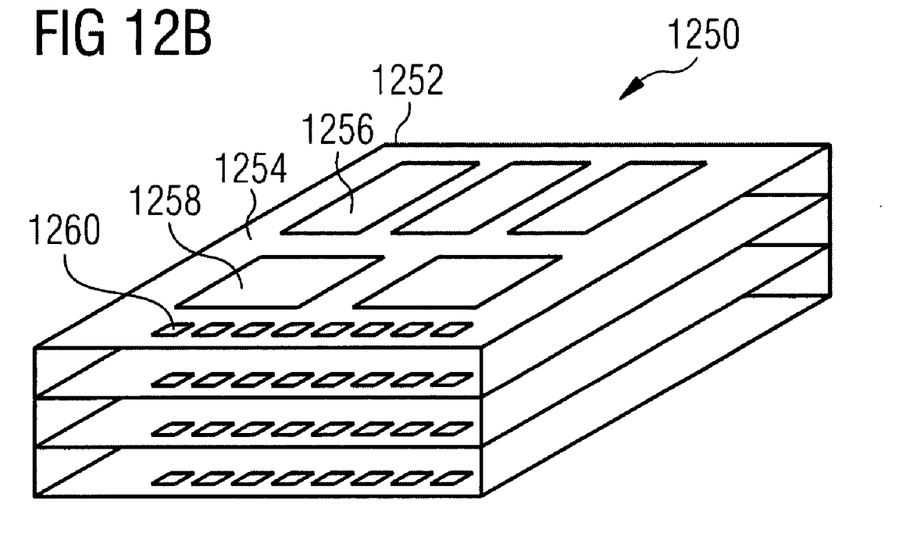

Memory cells such as are described above may be used in memory devices that contain large numbers of such cells. These cells may, for example, be organized into an array of memory cells having numerous rows and columns of cells, each of which stores one or more bits of information. Memory devices of this sort may be used in a variety of applications or systems. As shown in FIGS. 12A and 12B, in some embodiments, such memory devices may be used in memory modules. In FIG. 12A, a memory module 1200 is shown, on which one or more memory devices 1204 are arranged on a substrate 1202. The memory device 1204 may include numerous memory cells, each of which uses a memory element in accordance with an embodiment of the invention. The memory module 1200 may also include one or more electronic devices 1206, which may include memory, processing circuitry, control circuitry, addressing circuitry, bus interconnection circuitry, or other circuitry or electronic devices that may be combined on a module with a memory device, such as the memory device 1204. Additionally, the memory module 1200 includes multiple electrical connections 1208, which may be used to connect the memory module 1200 to other electronic components, including other modules.

As shown in FIG. 12B, in some embodiments, these modules may be stackable, to form a stack 1250. For example, a stackable memory module 1252 may contain one or more memory devices 1256, arranged on a stackable substrate 1254. The memory device 1256 contains memory cells that employ memory elements in accordance with an embodiment of the invention. The stackable memory module 1252 may also include one or more electronic devices 1258, which may include memory, processing circuitry, control circuitry, addressing circuitry, bus interconnection circuitry, or other circuitry or electronic devices that may be combined on a module with a memory device, such as the memory device 1256. Electrical connections 1260 are used to connect the stackable memory module 1252 with other modules in the stack 1250, or with other electronic devices. Other modules in the stack 1250 may include additional stackable memory modules, similar to the stackable memory module 1252 described above, or other types of stackable modules, such as stackable processing modules, control modules, communication modules, or other modules containing electronic components.

Figure 13:
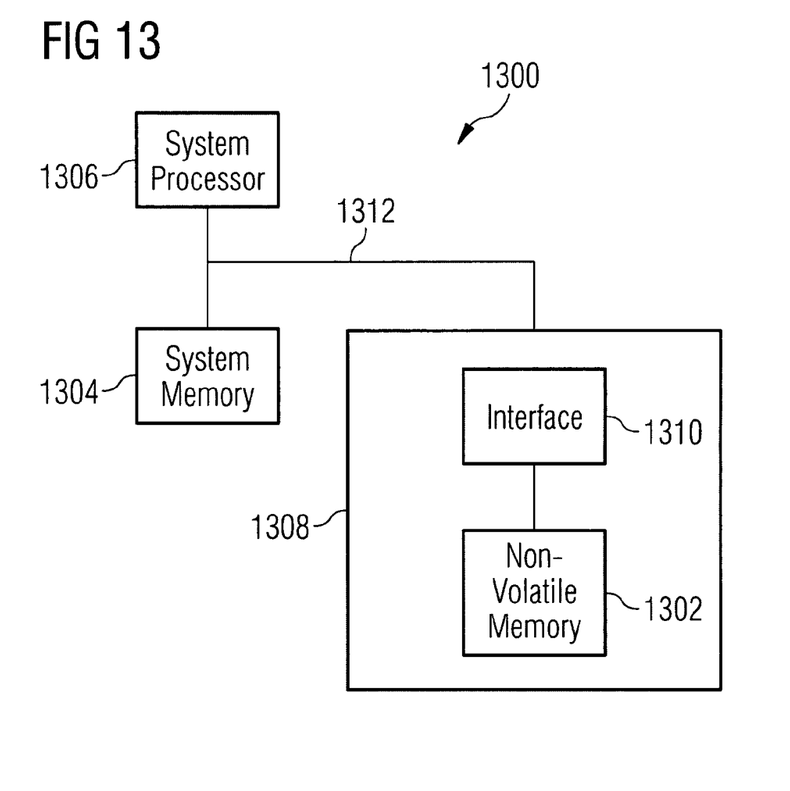
FIG. 13 shows a system that emulates a mass storage device using a non-volatile memory device according to an embodiment of the invention.

In some embodiments, a memory such as is described above may be used in a system that includes a variety of other components, such as input/output devices, processors, and/or additional memory devices. FIG. 13 shows a system 1300, in which a non-volatile memory 1302 according to an embodiment of the invention is used to emulate a hard drive or other mass storage device. Because the non-volatile memory 1302 has a faster access time than a typical hard drive, by storing commonly-used software and data on the non-volatile memory device, the performance of the system may be improved.

In this example, the system 1300 includes a system memory 1304, a system processor 1306, and an integrated circuit package 1308. The integrated circuit package 1308 includes the non-volatile memory 1302, and a controller 1310. A system bus 1312 interconnects the system memory 1304, the system processor 1306, and the integrated circuit package 1308. It will be understood that a variety of other devices (not shown) may also be interconnected on the system bus 1312, such as a variety of input/output devices (not shown), additional processors (not shown), or other devices suitable for use with a computing system.

The non-volatile memory 1302 includes memory cells in accordance with an embodiment of the invention, as described above. Within the integrated circuit package 1308, the non-volatile memory 1302 is connected to the controller 1310, which interfaces the non-volatile memory 1302 to the system bus 1312. Depending on the nature of the system bus 1312, the controller 1310 may emulate the interface of a hard disk or other mass storage device. The system memory 1304 may include conventional memory, such as conventional DRAM, or may include memory cells in accordance with the invention, as described above.

The non-volatile memory 1302 may be used to improve the performance and reliability of the system 1300 by storing commonly used applications and data. For example, the non-volatile memory 1302 may store components of an operating system. In some embodiments, the non-volatile memory 1302 may store software for emulating a hard disk or other mass storage device. In some such systems, the controller 1310 may include the ability to intercept a system boot process (such as a BIOS boot process on some computer systems), and install the software for emulating a hard disk from the non-volatile memory 1302 to the system memory 1304. In some embodiments, the non-volatile memory 1302 may be arranged so that it is accessed in a block-oriented manner, providing access to blocks of data, similar to the block-oriented manner in which data are arranged on a conventional hard disk drive. Generally the size of a block of data will depend on the amount of storage in the non-volatile memory, and typically ranges from 512 bytes to 64 kilobytes or more, though other block sizes may also be used.

It will be understood that the system shown in FIG. 13 is an example, and that many other system configurations may be used in accordance with embodiments of the invention. Alternative system configurations may include a variety of input/output devices, multiple processors, alternative bus configurations, and many other configurations of a computing system. Additionally, it will be understood that the components shown in FIG. 13 may be separate, or may be integrated into a single device or module, or into multiple devices and modules. For example, the system processor 1306 may be integrated into a single device with the system memory 1304 and one or more input/output devices. If will further be understood that a system such as is shown in FIG. 13 may be configured for general use, or for special purposes, such as cellular or wireless communication, photography, playing music or other digital media, or other purposes.

Figure 14:
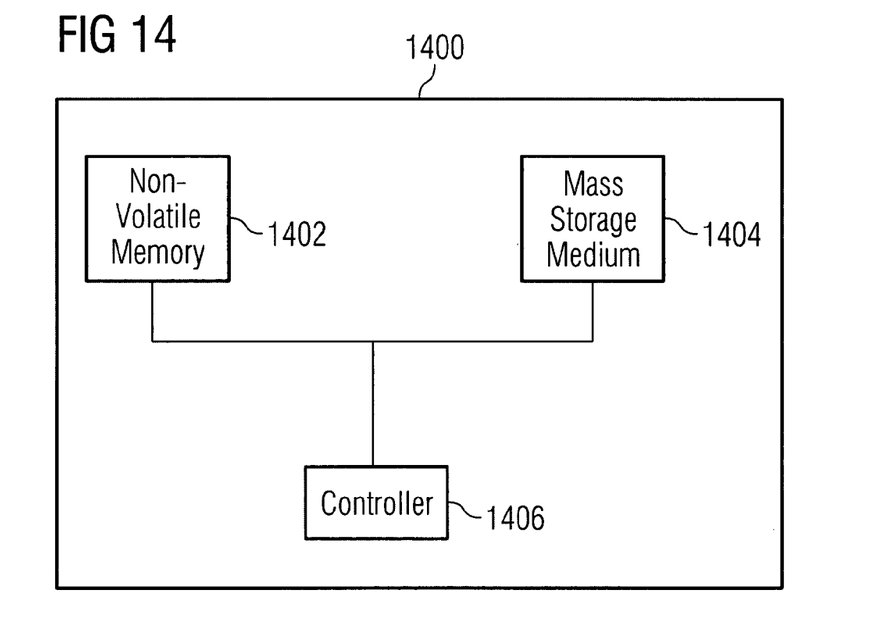
FIG. 14 shows a block diagram of a hybrid mass storage device that stores data to a mass storage device or to a non-volatile memory device according to an embodiment of the invention.

In some embodiments, a memory such as is described above may be used in hybrid mass storage device, such as a hybrid hard disk drive, as shown in FIG. 14. The hybrid drive 1400 shown in FIG. 14 includes a non-volatile memory 1402 that includes memory cells in accordance with an embodiment of the invention, as described above. Additionally, the hybrid drive 1400 includes a second mass storage medium 1404, such as a conventional magnetic hard disk or an optical disk, and a controller 1406. The controller 1406 is connected to the non-volatile memory 1402 and to the second mass storage medium 1404, and routes requests to access data storage to either the non-volatile memory 1402, the second mass storage medium 1404, or to both. In some embodiments, the controller 1406 may be combined with a mass storage device controller, such as a hard disk drive controller or an optical drive controller, and may handle the functions of a conventional mass storage device controller in addition to routing access requests to the non-volatile memory 1402 or the second mass storage medium 1404.

The hybrid drive 1400 is used in the same manner as a conventional hard disk drive, and generally will have the same appearance, dimensions, and interface as a conventional disk drive device or other mass storage device. However, because the non-volatile memory 1402 typically has a faster access time than the second mass storage medium 1404, and typically requires less power, the hybrid drive 1400 may achieve higher performance and lower power use than a conventional hard disk drive, by storing a portion of the data, such as frequently used data, in the non-volatile memory, rather than on the second mass storage medium.

Blocks of data on the hybrid drive 1400 may be accessed according to a block address, in a manner similar to those used with a conventional hard disk drive or other mass storage device. Based on the address, the controller 1406 may direct the request to the non-volatile memory 1402 or to the second mass storage medium 1404. In some embodiments, this is accomplished using an address mapping to determine how to direct access requests. This mapping may be stored in a table or other data structure that is used by the controller 1406 to route the access requests. Since most conventional mass storage devices access data in a block-oriented manner, in some embodiments, the non-volatile memory 1402 may be organized in a block-oriented manner, with block sizes typically ranging from 512 bytes to 64 kilobytes or more, though other block sizes are possible. Typically, the block size used for the non-volatile memory 1402 will be the same as the block size used for the second mass storage medium, though differing block sizes are possible, and may be used in some embodiments.

It will be understood that other configurations of a hybrid drive including a non-volatile memory may be used in accordance with an embodiment of the invention. For example, a hybrid drive may include additional mass storage devices, additional memory for use as a cache, or other configurations.

While the invention has been shown and described with reference to specific embodiments, it should be understood by those skilled in the art that various changes in form and detail may be made therein without departing from the spirit and scope of the invention as defined by the appended claims. For example, there are many materials that may be used as solid electrolytes or phase change materials, and there are other types of materials with modifiable conductivity that could be incorporated into the gate stack of a transistor/memory cell, in accordance with the invention. It will further be appreciated that such a modifiable conductivity element can be introduced into other transistor designs, such as FinFETs, nanowire transistors, or other transistor designs to provide a memory cell in accordance with the invention. Further, it will be understood that other embodiments, such as using poly-gate substitutions, may be used in accordance with the invention. Many other variants are possible. The scope of the invention is thus indicated by the appended claims and all changes that come within the meaning and range of equivalency of the claims are intended to be embraced.

What is claimed is:

1. A system comprising:
 a system memory;
 a processor;
 a bus that interconnects the system memory, the processor, and the integrated circuit memory device; and
 an integrated circuit memory device, the integrated circuit memory device comprising a controller that interfaces the integrated circuit memory device to the bus, the integrated circuit memory device having memory cells comprising:
  a transistor comprising a channel, a gate dielectric layer, a gate electrode, and a modifiable insulating layer disposed under the gate electrode and with at least a portion of the modifiable insulating layer in contact with the gate dielectric layer,
  wherein information stored in the memory cell depends on a changeable conductivity of the modifiable insulating layer, wherein the modifiable insulating layer comprises a low conductivity material, and further comprises a highly conductive filament in the low conductivity material changes a conductivity of the modifiable insulating layer,
  wherein the modifiable insulating layer further comprises an $sp^3$-rich carbon layer, and wherein the highly conductive filament comprises an $sp^2$-rich carbon filament formed in the $sp^3$-rich carbon layer.

2. The system of claim 1, wherein the non-volatile memory stores software that emulates a mass storage device.

3. The system of claim 1, wherein the controller intercepts a system boot process and installs the software that emulates a mass storage device from the non-volatile memory to the system memory.

4. The system of claim 1, wherein the non-volatile memory stores software and data that are frequently used by the system.

5. The system of claim 1, wherein the non-volatile memory stores portions of operating system software for the system.

6. The system of claim 1, wherein the non-volatile memory is block-oriented.

7. A hybrid mass storage system comprising:
 a non-volatile memory having memory cells comprising:
  a transistor comprising a channel, a gate dielectric layer, a gate electrode, and a modifiable insulating layer disposed under the gate electrode and with at least a portion of the modifiable insulating layer in contact with the gate dielectric layer,
  wherein information stored in the memory cell depends on a changeable conductivity of the modifiable insulating layer, wherein the modifiable insulating layer comprises a low conductivity material, and further comprises a highly conductive filament in the low conductivity material changes a conductivity of the modifiable insulating layer,
  wherein the modifiable insulating layer further comprises an $sp^3$-rich carbon layer, and wherein the highly conductive filament comprises an $sp^2$-rich carbon filament formed in the $sp^3$-rich carbon layer; and
 a second mass storage medium.

8. The hybrid mass storage system of claim 7, wherein the second mass storage medium comprises a hard disk drive.

9. The hybrid mass storage system of claim 7, wherein the second mass storage medium comprises an optical drive.

10. The hybrid mass storage system of claim 7, wherein the non-volatile memory has a faster access time than the second mass storage medium.

11. The hybrid mass storage system of claim 7, wherein the non-volatile memory uses less power than the second mass storage medium.

12. The hybrid mass storage system of claim 7, wherein the non-volatile memory is block-oriented.

13. The hybrid mass storage system of claim 7, wherein the non-volatile memory and the second mass storage medium are contained in a disk drive device.

14. The hybrid mass storage system of claim 7, further comprising a controller coupled to the non-volatile memory and the second mass storage medium, the controller selectively directing access requests to the non-volatile memory and the second mass storage medium.

15. The hybrid mass storage system of claim 14, wherein the controller selectively directs access requests to the non-volatile memory and the second mass storage medium based on an address of the request.

16. The hybrid mass storage system of claim 15, wherein the controller uses an address mapping to selectively direct access requests.

17. A hard disk drive device comprising:
 a hard disk storage medium;
 a non-volatile memory having memory cells comprising:
  a transistor comprising a channel, a gate dielectric layer, a gate electrode, and a modifiable insulating layer disposed under the gate electrode and with at least a portion of the modifiable insulating layer in contact with the gate dielectric layer,
  wherein information stored in the memory cell depends on a changeable conductivity of the modifiable insulating layer, wherein the modifiable insulating layer comprises a low conductivity material, and further comprises a highly conductive filament in the low conductivity material changes a conductivity of the modifiable insulating layer,
  wherein the modifiable insulating layer further comprises an $sp^3$-rich carbon layer, and wherein the highly conductive filament comprises an $sp^2$-rich carbon filament formed in the $sp^3$-rich carbon layer; and
 a controller coupled to the hard disk storage medium and the non-volatile memory, the controller selectively directing access requests to the non-volatile memory and the hard disk storage medium based on a requested address.

18. The hard disk drive device of claim 17, wherein the controller is integrated with a hard disk controller.

19. The hard disk drive device of claim 17, wherein the non-volatile memory is block-oriented.

20. The hard disk drive device of claim 17, wherein the non-volatile memory has a faster access time than the hard disk storage medium.

* * * * *

UNITED STATES PATENT AND TRADEMARK OFFICE
CERTIFICATE OF CORRECTION

| | | |
|---|---|---|
| PATENT NO. | : 8,097,872 B2 | Page 1 of 1 |
| APPLICATION NO. | : 11/708664 | |
| DATED | : January 17, 2012 | |
| INVENTOR(S) | : Franz Kreupl | |

It is certified that error appears in the above-identified patent and that said Letters Patent is hereby corrected as shown below:

In the Claims

On Column 15, line 48, Claim 3, the words "The system of claim 1..." should read -- The system of claim 2... --.

Signed and Sealed this
Twenty-seventh Day of August, 2013

Teresa Stanek Rea
*Acting Director of the United States Patent and Trademark Office*